US00RE43393E

(19) United States
(12) Reissued Patent
Master

(10) Patent Number: US RE43,393 E
(45) Date of Reissued Patent: *May 15, 2012

(54) METHOD AND SYSTEM FOR CREATING AND PROGRAMMING AN ADAPTIVE COMPUTING ENGINE

(75) Inventor: Paul L. Master, Sunnyvale, CA (US)

(73) Assignee: QST Holdings, LLC, Sunnyvale, CA (US)

( * ) Notice: This patent is subject to a terminal disclaimer.

(21) Appl. No.: 12/504,093

(22) Filed: Jul. 16, 2009

Related U.S. Patent Documents

Reissue of:
(64) Patent No.: 7,328,414
Issued: Feb. 5, 2008
Appl. No.: 10/437,800
Filed: May 13, 2003

U.S. Applications:
(60) Provisional application No. 60/378,088, filed on May 13, 2002.

(51) Int. Cl.
*G06F 17/50* (2006.01)

(52) U.S. Cl. ..... 716/104; 716/106; 716/116; 716/117; 716/128; 716/132

(58) Field of Classification Search ..... 716/103–104, 716/106–107, 116–117, 128, 132, 136, 138; 712/15, 17, 19, 29, 220, 227; 703/13–15; 709/106–107, 223; 711/145, 147, 149, 218; 717/114, 119, 149, 150, 160
See application file for complete search history.

(56) References Cited

U.S. PATENT DOCUMENTS

| | | | | |
|---|---|---|---|---|
| 5,603,043 | A | 2/1997 | Taylor et al. | |
| 5,966,534 | A | 10/1999 | Cooke et al. | |
| 7,246,333 | B2 * | 7/2007 | Bingham | 716/4 |
| 7,596,775 | B2 * | 9/2009 | Tsien et al. | 716/17 |
| 2003/0200538 | A1 * | 10/2003 | Ebeling et al. | 717/160 |
| 2004/0006584 | A1 * | 1/2004 | Vandeweerd | 709/107 |

* cited by examiner

*Primary Examiner* — Paul Dinh
(74) *Attorney, Agent, or Firm* — Nixon Peabody LLP

(57) ABSTRACT

A system for creating an adaptive computing engine (ACE) includes algorithmic elements adaptable for use in the ACE and configured to provide algorithmic operations, and provides mapping of the algorithmic operations to heterogeneous nodes. The mapping is for initially configuring the heterogeneous nodes to provide appropriate hardware circuit functions that perform algorithmic operations. A reconfigurable interconnection network interconnects the heterogeneous nodes. The mapping includes selecting a combination of ACE building blocks from the ACE building block types for the appropriate hardware circuit functions. The system and corresponding method also includes utilizing the algorithmic operations for optimally configuring the heterogeneous nodes to provide the appropriate hardware circuit function. The utilizing includes the simulating of the performance of the ACE with the combination of ACE building blocks and altering the combination until predetermined performance standards that determine the efficiency of the ACE are met while simulating performance of the ACE.

10 Claims, 3 Drawing Sheets

METHOD AND SYSTEM FOR CREATING AND PROGRAMMING AN ADAPTIVE COMPUTING ENGINE

Matter enclosed in heavy brackets [ ] appears in the original patent but forms no part of this reissue specification; matter printed in italics indicates the additions made by reissue.

*CROSS REFERENCE TO RELATED APPLICATIONS*

*This application claims the benefit of priority to U.S. Provisional Application No. 60/378,088, filed May 13, 2002.*

FIELD OF INVENTION

The present invention relates to adaptive computing machines, and more particularly to creating and programming an adaptive computing engine.

BACKGROUND OF THE INVENTION

The electronics industry has become increasingly driven to meet the demands of high-volume consumer applications, which comprise a majority of the embedded systems market. Examples of consumer applications where embedded systems are employed include handheld devices, such as cell phones, personal digital assistants (PDAs), global positioning system (GPS) receivers, digital cameras, etc. By their nature, these devices are required to be small, low-power, lightweight, and feature-rich. Thus, embedded systems face challenges in producing performance with minimal delay, minimal power consumption, and at minimal cost. As the numbers and types of consumer applications where embedded systems are employed increases, these challenges become even more pressing.

Each of these applications typically comprises a plurality of algorithms which perform the specific function for a particular application. An algorithm typically includes multiple smaller elements called algorithmic elements which when performed produce a work product. An example of an algorithm is the QCELP (QUALCOMM code excited linear prediction) voice compression/decompression algorithm which is used in cell phones to compress and decompress voice in order to save wireless spectrum.

Conventional systems in hardware architectures provide a specific hardware accelerator typically for one or two algorithmic elements. This has typically sufficed in the past since most hardware acceleration has been performed in the realm of infrastructure base stations. There, many channels are processed (typically 64 or more) and having one or two hardware accelerations, which help accelerate the two algorithmic elements, can be justified. Best current practices are to place a Digital Signal Processing IC alongside the specific hardware acceleration circuitry and then arraying many of these together in order to process the workload. Since any gain in performance or power dissipation is multiplied by the number of channels (64) this approach is currently favored.

For example, in a base station implementation of the QCELP algorithm acceleration the pitch computation will result in a 20% performance/power savings per channel. 20% of the processing which is done across 64 channels results in a significantly large performance/power savings.

The shortcomings with this approach are revealed when attempts are made to accelerate an algorithmic element in a mobile terminal. There typically is only a single channel is processed and for significant performance and power saving to be realized then many algorithmic elements must be accelerated. The problem, however, is that the size of the silicon is bounded by cost constraints and a designer can not justify added specific acceleration circuitry for every algorithm element. However, the QCELP algorithm itself consists of many individual algorithm elements (17 of the most frequently used algorithmic elements):

1. Pitch Search Recursive Convolution
2. Pitch Search Autocorrelation of Exx
3. Pitch Search Correlation of Exy
4. Pitch Search Autocorrelation of Eyy
5. Pitch Search Pitch Lag and Minimum Error
6. Pitch Search Sinc Interpolation of Exy
7. Pitch Search Interpolation of Eyy
8. Codebook Search Recursive convolution
9. Codebook Search Autocorrelation of Eyy
10. Codebook Search Correlation of Exy
11. Codebook Search Codebook index and Minimum Error
12. Pole Filter
13. Zero Filter
14. Pole 1 Tap Filter
15. Cosine
16. Line Spectral Pair Zero search
17. Divider For example, in a mobile terminal implementation of the QCELP algorithm, if the pitch computation is accelerated, the performance/power dissipation is reduced by 20% for an increased cost of silicon area. By itself, the gain for the cost is not economically justifiable. However, if for the cost in silicon area of a single accelerator there was an IC that can adapt itself in time to be able to become the accelerator for each of the 17 algorithmic elements, it would cost 80% of the cost for a single adaptable accelerator.

Normal design approaches for embedded systems tend to fall in one of three categories: an ASIC (application specific integrated circuit) approach; a microprocessor/DSP (digital signal processor) approach; and an FPGA (field programmable gate array) approach. Unfortunately, each of these approaches has drawbacks. In the ASIC approach, the design tools have limited ability to describe the algorithm of the system. Also, the hardware is fixed, and the algorithms are frozen in hardware. For the microprocessor/DSP approach, the general-purpose hardware is fixed and inefficient. The algorithms may be changed, but they have to be artificially partitioned and constrained to match the hardware. With the FPGA approach, use of the same design tools as for the ASIC approach result in the same problem of limited ability to describe the algorithm. Further, FPGAs consume significant power and are too difficult to reconfigure to meet the changes of product requirements as future generations are produced.

An alternative is to attempt to overcome the disadvantages of each of these approaches while utilizing their advantages. Accordingly, what is desired is a system in which more efficient consumer applications can be created and programmed than when utilizing conventional approaches.

SUMMARY OF THE INVENTION

A system for creating an adaptive computing engine (ACE) is disclosed. The system comprises a plurality of algorithmic elements capable of being configured into an adaptive computing engine, and means for mapping the operations of the plurality of algorithmic elements to non-homogenous nodes by using computational and data analysis. The system and method also includes means for utilizing the mapped algorithmic elements to provide the appropriate hardware function. A system and method in accordance with the present invention provides the ability to bring into existence efficient hardware accelerators for a particular algorithmic element and then to reuse the same silicon area to bring into existence a new hardware accelerator for the next algorithmic element.

With the ability to optimize operations of an ACE in accordance with the present invention, an algorithm is allowed to run on the most efficient hardware for the minimum amount of time required. Further, more adaptability is achieved for a wireless system to perform the task at hand during run time. Thus, algorithms are no longer required to be altered to fit predetermined hardware existing on a processor, and the optimum hardware required by an algorithm comes into existence for the minimum time that the algorithm needs to run.

DETAILED DESCRIPTION OF THE INVENTION

The present invention provides a method and system for optimizing operations of an ACE. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiments shown but is to be accorded the widest scope consistent with the principles and features described herein.

An approach that is dynamic both in terms of the hardware resources and algorithms is emerging and is referred to as an adaptive computing engine (ACE) approach. ACEs can be reconfigured upwards of hundreds of thousands of times a second while consuming very little power. The ability to reconfigure the logical functions inside the ACE at high speed and "on-the-fly", i.e., while the device remains in operation, describes the dynamic hardware resource feature of the ACE. Similarly, the ACE operates with dynamic algorithms, which refers to algorithms with constituent parts that have temporal elements and thus are only resident in hardware for short portions of time as required.

Figure 1:
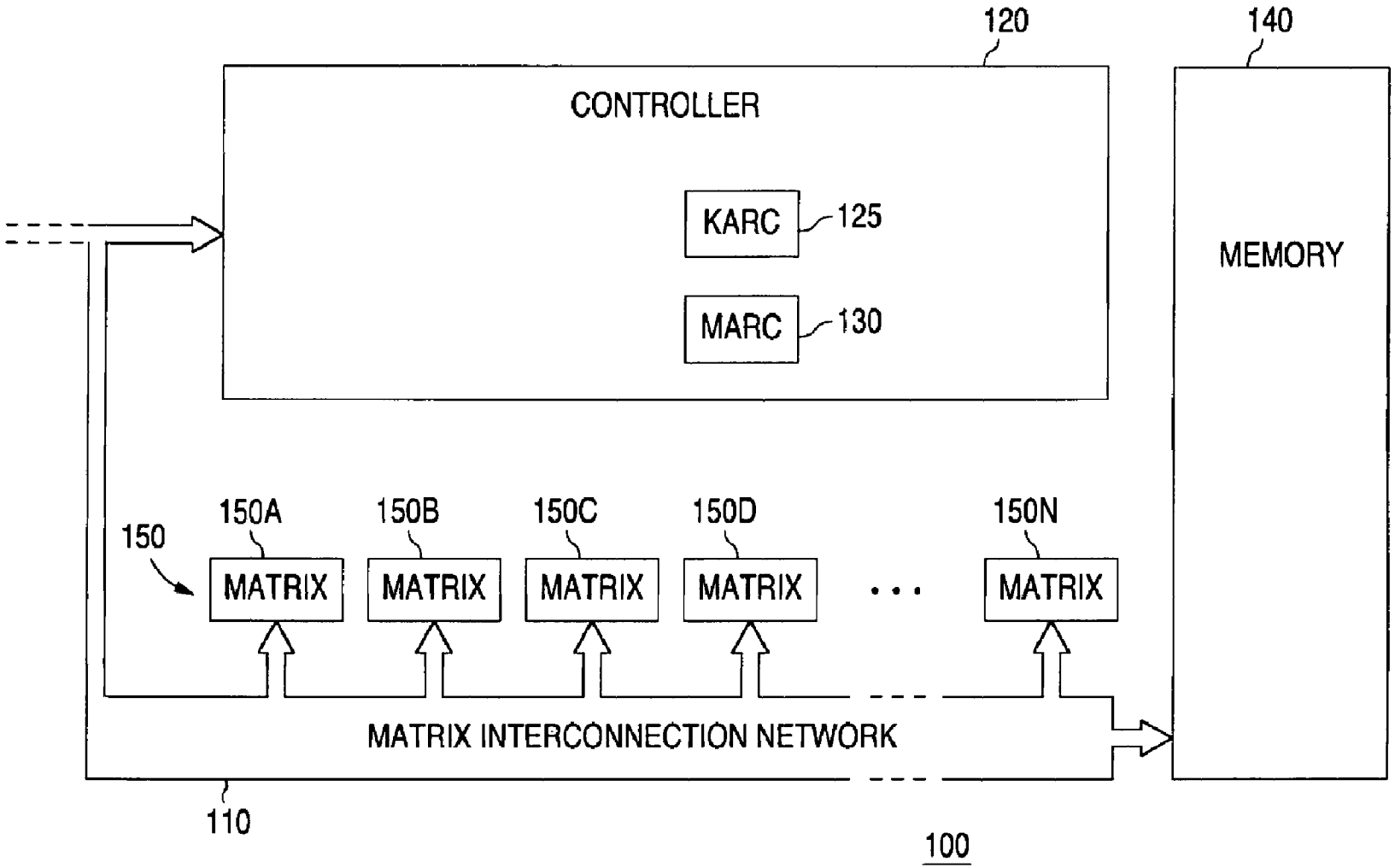
FIG. 1 is a block diagram illustrating a preferred apparatus in accordance with the present invention.

While the advantages of on-the-fly adaptation in ACE approaches are easily demonstrated, a need exists for a tool that supports optimizing of the ACE architecture for a particular problem space. FIG. 1 is a block diagram illustrating a preferred apparatus 100 in accordance with the present invention. The apparatus 100, referred to herein as an adaptive computing machine ("ACE") 100, is preferably embodied as an integrated circuit, or as a portion of an integrated circuit having other, additional components. In the preferred embodiment, and as discussed in greater detail below, the ACE 100 includes a controller 120, one or more reconfigurable matrices 150, such as matrices 150A through 150N as illustrated, a matrix interconnection network 110, and preferably also includes a memory 140.

A significant departure from the prior art, the ACE 100 does not utilize traditional (and typically separate) data and instruction busses for signaling and other transmission between and among the reconfigurable matrices 150, the controller 120, and the memory 140, or for other input/output ("I/O") functionality. Rather, data, control and configuration information are transmitted between and among these elements, utilizing the matrix interconnection network 110, which may be configured and reconfigured, in real-time, to provide any given connection between and among the reconfigurable matrices 150, the controller 120 and the memory 140, as discussed in greater detail below.

The memory 140 may be implemented in any desired or preferred way as known in the art, and may be included within the ACE 100 or incorporated within another IC or portion of an IC. In the preferred embodiment, the memory 140 is included within the ACE 100, and preferably is a low power consumption random access memory (RAM), but also may be any other form of memory, such as flash, DRAM, SRAM, MRAM, ROM, EPROM or EEPROM. In the preferred embodiment, the memory 140 preferably includes direct memory access (DMA) engines, not separately illustrated.

The controller 120 is preferably implemented as a reduced instruction set ("RISC") processor, controller or other device or IC capable of performing the two types of functionality discussed below. The first control functionality, referred to as "kernal" control, is illustrated as kernal controller ("KARC") 125, and the second control functionality, referred to as "matrix" control, is illustrated as matrix controller ("MARC") 130. The control functions of the KARC 125 and MARC 130 are explained in greater detail below, with reference to the configurability and reconfigurability of the various matrices 150, and with reference to the preferred form of combined data, configuration and control information referred to herein as a "silverware" module.

The matrix interconnection network 110 of FIG. 1, and its subset interconnection networks collectively and generally referred to as "interconnect", "interconnection(s)" or "interconnection network(s)", may be implemented as known in the art, such as utilizing the interconnection networks or switching fabrics of FPGAs, albeit in a considerably more limited, less "rich" fashion, to reduce capacitance and increase speed of operation. In the preferred embodiment, the various interconnection networks are implemented as described, for example, in U.S. Pat. Nos. 5,218,240, 5,336,950, 5,245,277, and 5,144,166. These various interconnection networks provide selectable (or switchable) connections between and among the controller 120, the memory 140, the various matrices 150, providing the physical basis for the configuration and reconfiguration referred to herein, in response to and under the control of configuration signaling generally referred to herein as "configuration information". In addition, the various interconnection networks including 110 and the interconnection networks within each of the matrices (not shown) provide selectable or switchable data, input, output, control and configuration paths, between and among the controller 120, the memory 140, the various matrices 150, and the computational units (not shown) and computational elements (not shown) within the matrices 150 in lieu of any form of traditional or separate input/output busses, data busses, and instruction busses.

The various matrices 150 are reconfigurable and heterogeneous, namely, in general, and depending upon the desired configuration: reconfigurable matrix 150A is generally different from reconfigurable matrices 150B through 150N;

reconfigurable matrix 150B is generally different from reconfigurable matrices 150A and 150C through 150N; reconfigurable matrix 150C is generally different from reconfigurable matrices 150A, 150B and 150D through 150D, and so on. The various reconfigurable matrices 150 each generally contain a different or varied mix of computation units, which in turn generally contain a different or varied mix of fixed, application specific computational elements, which may be connected, configured and reconfigured in various ways to perform varied functions, through the interconnection networks. In addition to varied internal configurations and reconfigurations, the various matrices 150 may be connected, configured and reconfigured at a higher level, with respect to each of the other matrices 150, through the matrix interconnection network 110.

Figure 2:
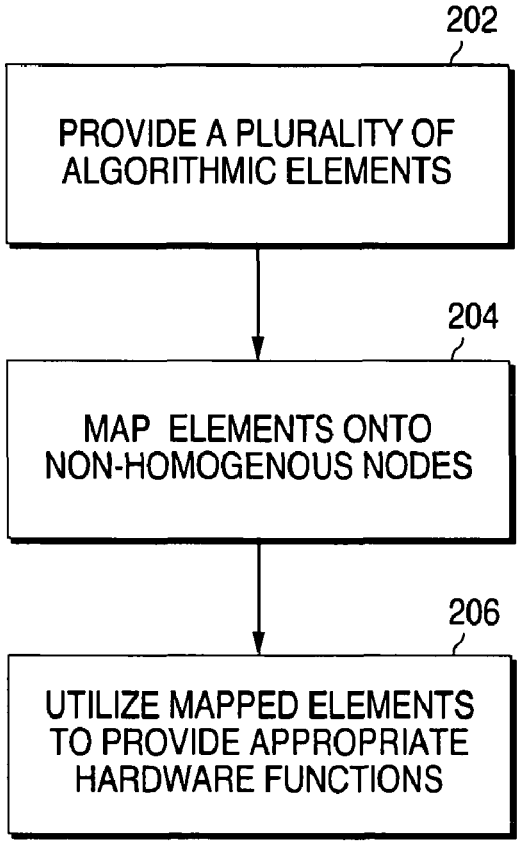
FIG. 2 illustrates a simple flow chart of providing an ACE in accordance with the present invention.

FIG. 2 illustrates a simple flow chart of providing an ACE in accordance with the present invention. First, a plurality of algorithmic elements are provided, via step 202. Next, the algorithmic elements are mapped onto non-homogeneous, i.e., heterogeneous, nodes by using data and computational analyses, via step 204. Finally, the mapped algorithmic elements within the node are utilized to provide the appropriate hardware function, via step 206. In a preferred embodiment, the algorithmic elements within a node are segmented to over optimize performance. The segmentation can either be spacial, that is, ensuring elements are close to each other, or the segmentation can be temporary, that is, the elements come into existence at different points in time.

Figure 3:
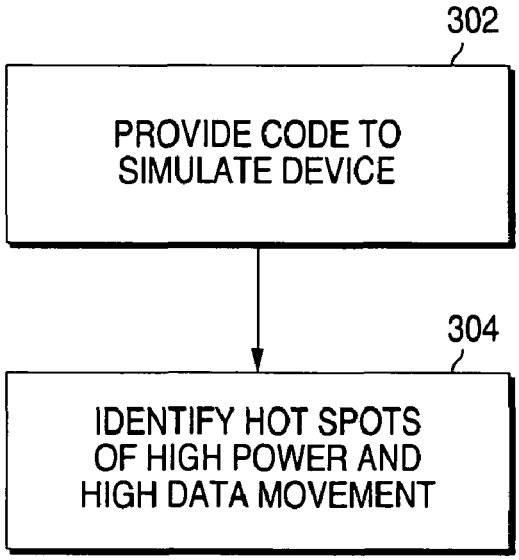
FIG. 3 is a flow chart which illustrates the operation of the profiler in accordance with the present invention.

The data and computational and analysis of the algorithmic mapping step 204 is provided through the use of a profiler. The operation of the profiler is described in more detail herein below in conjunction with the accompanying figure. FIG. 3 is a flow chart which illustrates the operation of the profiler in accordance with the present invention.

First code is provided to simulate the device, via step 302. From the design code hot spots are identified, via step 304. Hot spots are those operations which utilize high power and/or require a high amount of movement of data (data movement). The identification of hot spots, in particular the identification of data movement is important in optimizing the performance of the implemented hardware device. A simple example of the operation of the profiler is described below.

A code that is to be profiled is shown below:

```
line 1:   for (i = 0 to 1023) {                  // do this loop 1024 times
line 2:      x[i] = get data from producer A      // fill up an array of 1024
line 3:   }
line 4:
line 5:   for(;;)                                // do this loop forever
line 6:   sum = 0                                // initialize variable sum
line 7:   temp = get data from producer B        // get a new value
line 8:   for (j = to 1023) {                    // do this loop 1024 times
line 9:      sum = sum + x[i] * temp             // perform multiply
                                                 accumulate
line 10:  }
line 11:  send sum to consumer C                 // send sum
line 12:  }
```

This illustrates three streams of data, producer A on line 2, producer B on line 6 and a consumer of data on line 10. The producers or consumers may be variables, may be pointers, may be arrays, or may be physical devices such as Analog to Data Converters (ADC) or Data to Analog Converters (DAC). Traditional profilers would identify line 8 as a computational hot spot an area of the code which consumes large amounts of computations. Line 8 consists of a multiply followed by an accumulation which, on some hardware architecture, may take many clock cycles to perform. What this invention will identify which is not performed in existing profiles is identify not only the computation hot spots, but also memory hot spots as well as data movement hotspots. Line 7 and line 11 are identified as data movement hot spots since the data will be input from the producer B on line 7 and the sum will be sent to consumer C in line 11. Also identified by the profiler as a secondary data movement hot spot is line 2 where 1024 values from Producer A will be moved into the array X. Finally, line 9 is identified as a data movement hot spot since an element of the array x and the temp value are summed with the variable sum and the result placed back into the variable sum. The profile will also identify on line 9 the array x as a memory hotspot followed, secondarily, by line 2 array x as a memory hotspot.

With this information from the profiler, the ACE can instantiate the following hardware circuitry to accelerate the performance as well as lower the power dissipation of this algorithmic fragment (algorithmic element) by putting the building block elements together. Data movements will be accelerated by constructing from the low level ACE building blocks DMA (Direct Memory Address) hardware to perform the data movement on lines 2, 9, 7, 11. A specific hardware accelerator to perform the computation on line 9 will be constructed from the lower level ACE building blocks to construct a Multiply Accumulate hardware accelerator. Finally, the information from the profiler on the memory hot spot on line 2 and line 9 will allow the ACE to either build a memory array of exactly 1024 elements from the low level ACE building blocks or ensure that the smallest possible memory which can fit 1024 elements is used. Optimal sizing of memory is mandatory to ensure low power dissipation. In addition, the profiling information on the memory hot spot on line 9 is used to ensure that the ACE will keep the circuitry for the multiply accumulate physically local to the array x to ensure the minimum physical distance which is directly proportional to the effective capacitance.—the greater the distance between where data is kept and where data is processed means greater capacitance, which is one of the prime elements which dictates power consumption.

The resources needed for implementing the algorithmic elements specify the types of composite blocks needed for a given problem, the number of each of the types that are needed, and the number of composite blocks per minimatrix. The composite blocks and their types are preferably stored in a database. By way of example, one type of composite block may be labeled linear composite blocks and include multipliers, adders, double adders, multiply double accumulators, radix 2, DCT, FIR, IIR, FFT, square root, divides. A second type may include Taylor Series approximation, CORDIC, sines, cosines, polynomial evaluations. A third type may be labeled FSM (finite status machine) blocks, while a fourth type may be termed FPGA blocks. Bit processing blocks may form a fifth type, and memory blocks may form a sixth type of composite block.

Figure 4:
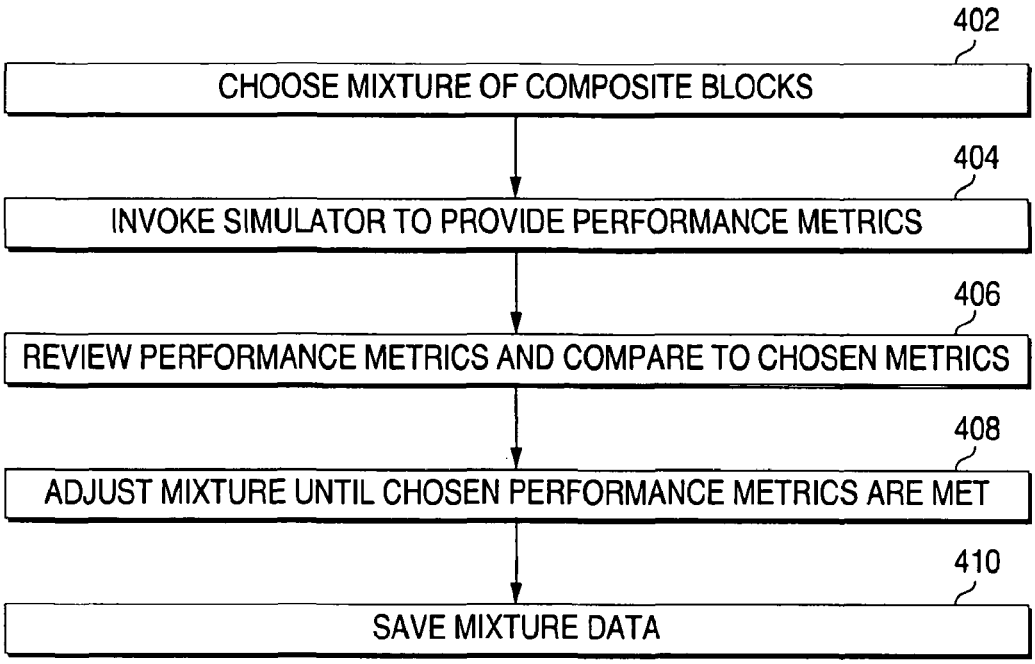
FIG. 4 is a flow chart which illustrates optimizing the mixture of composite blocks.

FIG. 4 is a flow chart which illustrates optimizing the mixture of composite blocks. First, a mixture of composite blocks are chosen, via step 402. Given a certain mixture of composite blocks, composite block types, and interconnect density, a simulator/resource estimator/scheduler is invoked to provide performance metrics, via step 404. In essence, the performance metrics determine the efficiency of the architecture to meet the desired goal. Thus, the operations by the designated hardware resources are simulated to identify the metrics of the combination of composite blocks. The metrics produced by the simulation are then reviewed to determine whether they meet the chosen performance metrics, via step 406. When the chosen performance metrics are not met, the combination of resources provided by the composite blocks is adjusted until the resulting metrics are deemed good enough, via step 408. By way of example, computation power efficiency (CPE) refers to the ratio of the number of gates actively working in a clock cycle to the total number of gates in the device. A particular percentage for CPE can be chosen as a performance metric that needs to be met by the combination of composite blocks.

Once the chosen performance metrics are met, the information about which composite blocks were combined to achieve the particular design code is stored in a database, via step 410. In this manner, subsequent utilization of that design code to optimize an ACE is realized by accessing the saved data. For purposes of this discussion, these combinations are referred to as dataflow graphs.

Figure 5:
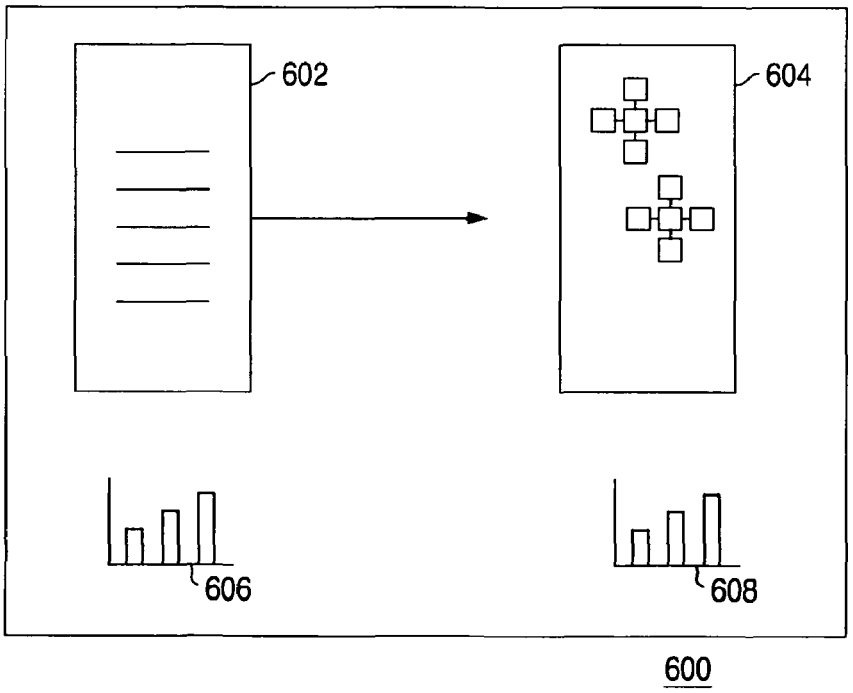
FIG. 5 illustrates an integrated environment in accordance with the present invention.

To implement the flow chart of FIG. 4 an integrated environment is provided to allow a user to make the appropriate tradeoffs between power performance and data movement. FIG. 5 illustrates an integrated environment 600 in accordance with the present invention. A legacy code of a typical design on one chart 602 is provided alongside the corresponding ACE architecture on the other chart 604. Power, performance and data movement readings are provided at the bottom of each of the charts 606 and 608. In a preferred embodiment, it would be possible to drag and drop code from the legacy chart 602 onto one of the mini-matrices of the ACE chart 604. In a preferred embodiment there would be immediate feedback, that is, as a piece of code was dropped on the ACE chart 604, the power energy and data movement reading would change to reflect the change. Accordingly, through this process an ACE which is optimized for a particular performance can be provided.

As mentioned before, the ACE can be segmented spatially and temporally to ensure that a particular task is performed in the optimum manner. By adapting the architecture over and over, a slice of ACE material builds and dismantles the equivalent of hundreds or thousands of ASIC chips, each optimized to a specific task. Since each of these ACE "architectures" is optimized so explicitly, conventional silicon cannot attempt its recreation, conventional ASIC chips would be far too large, and microprocessors/DSPs far too customized. Further, the ACE allows software algorithms to build and then embed themselves into the most efficient hardware possible for their application. This constant conversion of "software" into "hardware" allows algorithms to operate faster and more efficiently than with conventional chip technology. ACE technology also extends conventional DSP functionality by adding a greater degree of freedom to such applications as wireless designs that so far have been attempted by changing software.

Adapting the ACE chip architecture as necessary introduces many new system features within reach of a single ACE-based platform. For example, with an ACE approach, a wireless handset can be adapted to become a handwriting or voice recognition system or to do on-the-fly cryptography. The performance of these and many other functions at hardware speeds may be readily recognized as a user benefit while greatly lowering power consumption within battery-driven products.

In a preferred embodiment, the hardware resources of an ACE are optimized to provide the necessary resources for those parts of the design that most need those resources to achieve efficient and effective performance. By way of example, the operations of a vocoder, such as a QCELP (QUALCOMM's Code Excited Linear Predictive), provide a design portion of a cellular communication device that benefits from the optimizing of an ACE. As a vector quantizer-based speed codec, a QCELP coding speech compression engine has eight inner loops/algorithms that consume most of the power. These eight algorithms include code book search, pitch search, line spectral pairs (LSP) computation, recursive convolution and four different filters. The QCELP engine thus provides an analyzer/compressor and synthesizer/decompressor with variable compression ranging from 13 to 4 kilobits/second (kbit/s).

With the analyzer operating on a typical DSP requiring about 26 MHz of computational power, 90 percent of the power and performance is dissipated by 10 percent of the code, since the synthesizer needs only about half that performance. For purposes of this disclosure, a small portion of code that requires a large portion of the power and performance dissipated is referred to as a hot spot in the code. The optimization of an ACE in accordance with the present invention preferably occurs such that it appears that a small piece of silicon is time-sliced to make it appear as an ASIC solution in handling the hot spots of coding. Thus, for the example QCELP vocoder, when data comes into the QCELP speech codec every 20 milliseconds, each inner loop is applied 50 times a second. By optimizing the ACE, the hardware required to run each inner loop algorithm 400 times a second is brought into existence.

With the ability to optimize operations of an ACE in accordance with the present invention, an algorithm is allowed to run on the most efficient hardware for the minimum amount of time required. Further, more adaptability is achieved for a wireless system to perform the task at hand during run time. Thus, algorithms are no longer required to be altered to fit predetermined hardware existing on a processor, and the optimum hardware required by an algorithm comes into existence for the minimum time that the algorithm needs to run.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for creating an adaptive computing engine (ACE), the system comprising:

algorithmic elements adaptable for use in the ACE and configured to provide algorithmic operations;

means for mapping the algorithmic operations to heterogeneous nodes such that the heterogeneous nodes are initially configured to provide appropriate hardware circuit functions that perform the algorithmic operations, the heterogeneous nodes being coupled with each other by a reconfigurable interconnection network, the mapping by the mapping means including selecting a combination of ACE building blocks from ACE building block types for the appropriate hardware circuit functions; and means for utilizing the algorithmic operations such that the heterogeneous nodes are optimally configured to provide the appropriate hardware circuit functions, the utilizing by the utilizing means including simulating performance of the ACE with the combination of ACE building blocks and altering the combination of ACE building blocks until predetermined performance standards that determine an efficiency of the ACE are met while simulating performance of the ACE.

2. The system of claim 1 wherein the ACE building blocks types include linear computation block types, finite state machine block types, field programmable gate array block types, bit processor block types, and memory block types.

3. The system of claim 1 wherein the mapping means further includes a profiler that comprises:

means for providing code to simulate a hardware design that performs the algorithmic operations; and means for identifying one or more hot spots in the code, wherein the identified hot spots are those areas of code requiring high power and/or high data movement and the mapping means selects the combination of ACE building blocks based on the identified hot spots.

4. The system of claim 3 wherein each hot spot comprises a computational hot spot or a data movement hot spot.

5. The system of claim 4 wherein the mapping means uses each data movement hot spot to restrict high data movements to a minimum physical distance in the ACE.

6. A method for creating an adaptive computing engine (ACE), the method comprising:

providing algorithmic elements adaptable for use in the ACE and configured to provide algorithmic operations;

mapping, *using a processor,* the algorithmic operations to heterogeneous nodes such that the heterogeneous nodes are initially configured to provide appropriate hardware circuit functions that perform the algorithmic operations, the heterogeneous nodes being coupled with each other by a reconfigurable interconnection network, the mapping including selecting a combination of ACE building blocks from ACE building block types for the appropriate hardware circuit functions; and utilizing the algorithmic operations such that the heterogeneous nodes are optimally configured to provide the appropriate hardware circuit functions, the utilizing comprising simulating performance of the ACE with the combination of ACE building blocks and altering the combination of ACE building blocks until predetermined performance standards that determine an efficiency of the ACE are met while simulating performance of the ACE.

7. The method of claim 6 wherein the ACE building blocks types include linear computation block types, finite state machine block types, field programmable gate array block types, bit processor block types, and memory block types.

8. The method of claim 6 wherein the mapping further includes profiling using a profiler, wherein the profiling comprises:

providing code to simulate a hardware design that performs the algorithmic operations; and identifying one or more hot spots in the code, wherein the identified hot spots are those areas of code requiring high power and/or high data movement and the mapping selects the combination of ACE building blocks based on the identified hot spots.

9. The method of claim 8 wherein each hot spot comprises a computational hot spot or a data movement hot spot.

10. The method of claim 9 wherein the mapping uses each data movement hot spot to restrict high data movements to a minimum physical distance in the ACE.

* * * * *